(12) United States Patent  
Tanzawa

(10) Patent No.: US 8,013,579 B2  
(45) Date of Patent: Sep. 6, 2011

(54) VOLTAGE TRIMMING

(75) Inventor: Toru Tanzawa, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 784 days.

(21) Appl. No.: 11/888,829

(22) Filed: Aug. 2, 2007

(65) Prior Publication Data

US 2009/0033306 A1  Feb. 5, 2009

(51) Int. Cl.  
*G05F 1/10* (2006.01)

(52) U.S. Cl. .................. 323/234; 327/540; 365/226

(58) Field of Classification Search .......... 323/282, 323/283, 284, 351; 327/540, 541; 365/226; 341/121  
See application file for complete search history.

(56) References Cited

U.S. PATENT DOCUMENTS

| | | | |
|---|---|---|---|
| 6,909,642 B2 * | 6/2005 | Lehmann et al. | 365/189.09 |
| 7,352,230 B2 * | 4/2008 | An | 327/334 |
| 7,579,903 B2 * | 8/2009 | Oku | 327/538 |
| 2005/0229050 A1 * | 10/2005 | Kanda | 714/718 |
| 2006/0056238 A1 | 3/2006 | Park et al. | |
| 2006/0061404 A1 | 3/2006 | An | |

OTHER PUBLICATIONS

Kang-Deog Suh, et al.; "A 3.3V 32Mb NAND Flash Memory with Incremental step Pulse Programming Scheme": 1996 IEEE International Solid State Circuits Conference, Feb. 16, 1995: pp. 128-130.  
M. Bauer, et al.; "TA 7.7: A Multilevel-Cell 32Mb Flash Memory"; 1995 IEEE International Solid State Circuits Conference; Feb. 16, 1995; pp. 132-134.  
Toru Tanzawa, et al.; "Wordline Voltage Generating System for Low-Power Low-Voltage Flash Memories"; IEEE Jouirnal of Solid-State Circuits, vol. 36, No. 1; Jan. 2001; pp. 55-63.

* cited by examiner

*Primary Examiner* — Jessica Han  
(74) *Attorney, Agent, or Firm* — Fletcher Yoder

(57) ABSTRACT

Embodiments are provided that include a memory die, memory devices, and methods, such as those comprising a voltage generator, including an output voltage and an adjustment circuit configured to cause adjustment of the output voltage based on a latch signal. Further one such method includes applying an input voltage to an input of a voltage generator, adjusting the input voltage to an adjusted voltage, comparing the adjusted voltage to a reference voltage, generating trim data based on the comparison and storing the trim data.

17 Claims, 12 Drawing Sheets

VOLTAGE TRIMMING

BACKGROUND OF THE INVENTION

1. Field of the Invention

The present invention relates generally to the field of memory devices and more particularly, in one or more embodiments, to trimming internal voltages of flash memory.

2. Description of the Related Art

Flash memory is a non-volatile memory that can be electrically erased and reprogrammed. It is primarily used in memory cards, USB flash drives, and the like for storage of data in computer systems. Generally, flash memory stores information on an array of floating gate transistors, called "cells", each of which traditionally stores one bit of information. Each cell is characterized by a threshold voltage (Vt). By adding or removing charge from a floating gate, the threshold voltage of the cell changes, thereby defining whether the cell is programmed or erased. The threshold voltage level indicates the value for a single bit of information, generally represented as a 1 or 0.

Other flash memory devices, referred to as multi-level cell devices (MLC's), can store more than one bit per cell by charging the floating gate to different levels. This technique varies the threshold voltage across a set of ranges. A two bit value is assigned to each specific voltage range, as opposed to a single bit assigned to each range above and below a single value. In a two bit MLC, four voltage ranges may be used to represent the four possible values of the two bits, i.e., 00, 01, 10, and 11.

To increase the number of bits stored on a single cell, MLC devices should be able to manage voltages and charges precisely. For instance, during programming a precise charge must be placed onto the floating gate of a cell to produce a voltage within a desired range. Similarly, during a read operation, a precise read voltage is placed on the control gate, the source is grounded, and a drain bias is applied across the cell, such that the cell conducts a current proportional to the cell's voltage. In a MLC that stores two bits per cell, the voltages supplied may include three program verify voltages, three read voltages, and one erase verify voltage. Accordingly, a memory device may include numerous voltage sources that provide voltages to the cells of the memory array or to other locations within the memory.

The supplied voltages are generally provided by internal voltage generators that are connected to the transistor making up each cell. For instance, each memory die may include multiple voltage generators configured to output a voltage for the program, read and write operations. Often, there may be variations between the desired voltage level output and the actual voltage level output from each voltage source. In memory applications, including MLC applications, it is often desirable that each voltage generator be internally adjusted (e.g., modified, regulated, calibrated, and/or trimmed) to provide an accurate voltage level. Individually adjusting each voltage source of a memory device can be time consuming and costly. Further, as the number of memory devices and the number of supply voltages increase, such as in MLC applications, the number of desired adjustments may increase drastically, and require more time and effort.

Embodiments of the present invention may be directed to one or more of the problems set forth above.

DETAILED DESCRIPTION OF SPECIFIC EMBODIMENTS

Figure 1:
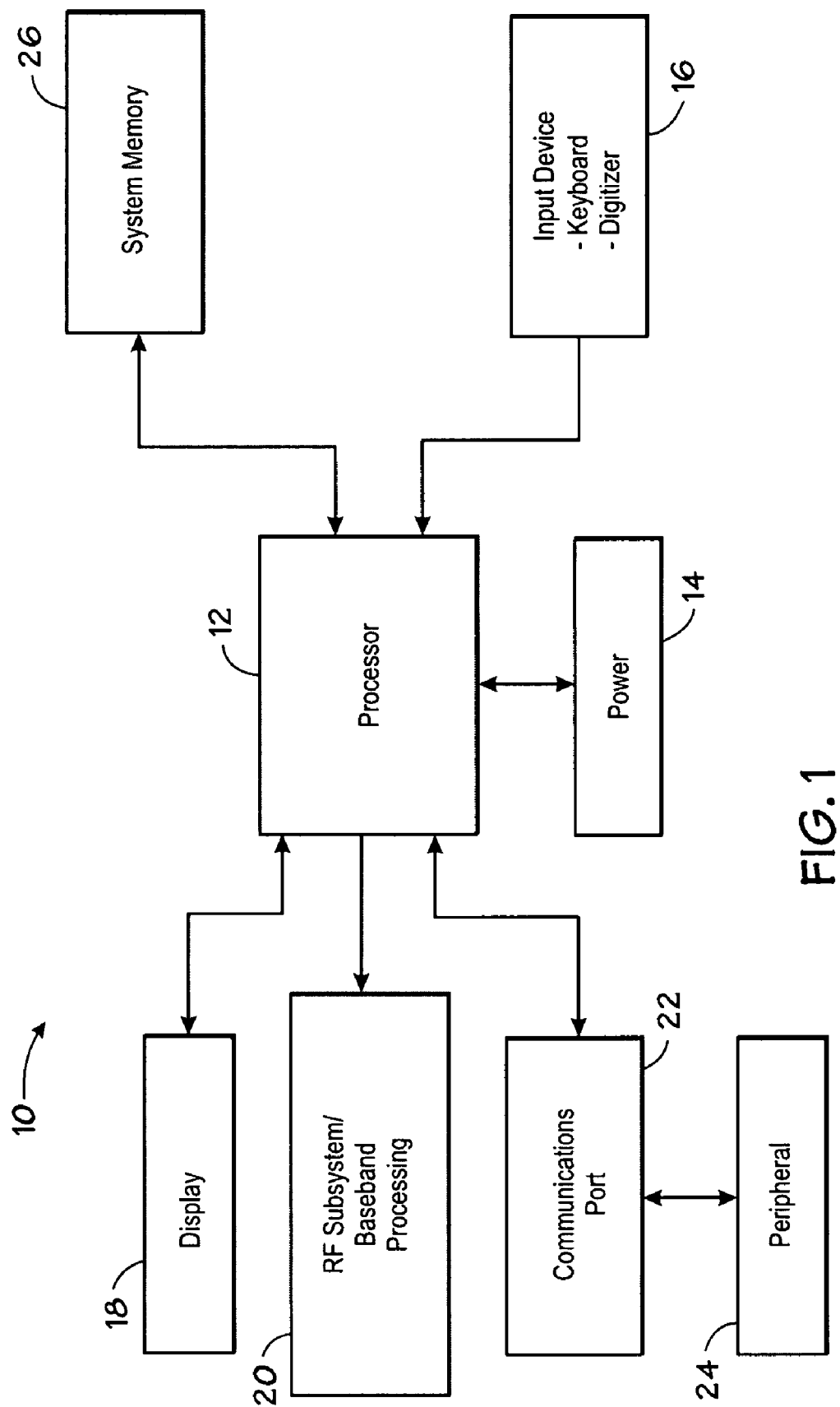
FIG. 1 illustrates a block diagram of a processor-based device having a memory that includes memory devices fabricated in accordance with one or more embodiments of the present invention.

FIG. 1 illustrates a block diagram depicting a processor-based system, generally designated by reference numeral 10. The system 10 may be any of a variety of types such as a computer, pager, cellular phone, personal organizer, control circuit, etc. In a typical processor-based device, a processor 12, such as a microprocessor, controls the processing of system functions and requests in the system 10. Further, the processor 12 may comprise a plurality of processors that share system control.

The system 10 typically includes a power supply 14. For instance, if the system 10 is a portable system, the power supply 14 may advantageously include permanent batteries, replaceable batteries, and/or rechargeable batteries. The power supply 14 may also include an AC adapter, so the system 10 may be plugged into a wall outlet, for instance. The power supply 14 may also include a DC adapter such that the system 10 may be plugged into a vehicle cigarette lighter, for instance.

Various other devices may be coupled to the processor 12 depending on the functions that the system 10 performs. For instance, a user interface 16 may be coupled to the processor 12. The user interface 16 may include buttons, switches, a keyboard, a light pen, a mouse, and/or a voice recognition system, for instance. A display 18 may also be coupled to the processor 12. The display 18 may include an LCD display, a CRT, LEDs, and/or an audio display, for example.

Furthermore, an RF sub-system/baseband processor 20 may also be couple to the processor 12. The RF sub-system/baseband processor 20 may include an antenna that is coupled to an RF receiver and to an RF transmitter (not shown). A communications port 22 may also be coupled to the processor 12. The communications port 22 may be adapted to be coupled to one or more peripheral devices 24 such as a modem, a printer, a computer, or to a network, such as a local area network, remote area network, intranet, or the Internet, for instance.

Because the processor 12 controls the functioning of the system 10 by implementing software programs, memory is used to enable the processor 12 to be efficient. Generally, the memory is coupled to the processor 12 to store and facilitate execution of various programs. For instance, the processor 12 may be coupled to system memory 26, which may include volatile memory, such as Dynamic Random Access Memory (DRAM) and/or Static Random Access Memory (SRAM). The system memory 26 may also include non-volatile memory, such as read-only memory (ROM), EEPROM, and/or flash memory to be used in conjunction with the volatile memory. As described further below, the system memory 26 may include one or more memory devices, such as flash memory devices, that may include a floating gate memory array fabricated in accordance with one or more embodiments of the present invention.

Figure 2:
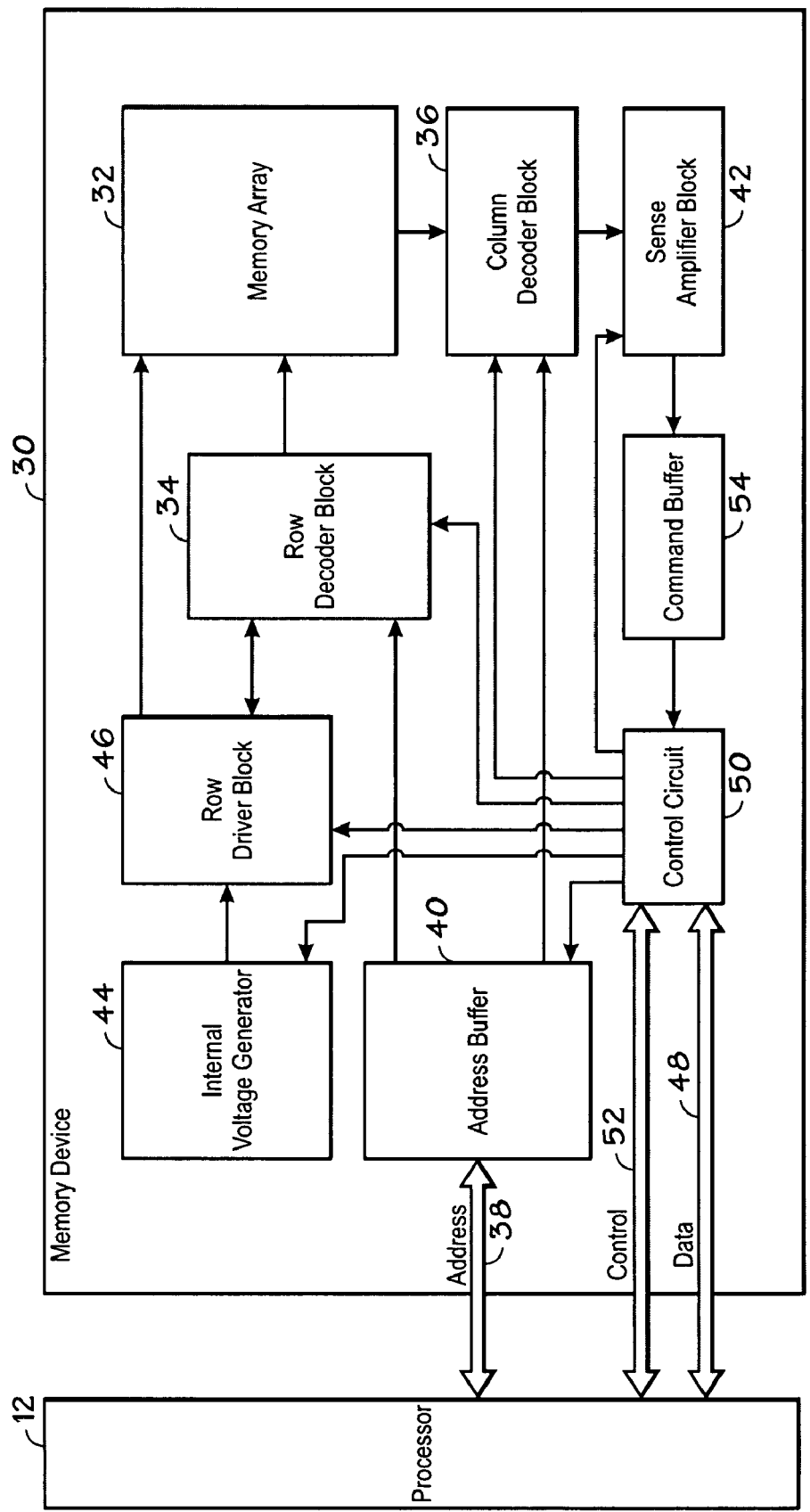
FIG. 2 illustrates a block diagram of a memory device having a memory array fabricated in accordance with one or more embodiments of the present invention.

FIG. 2 is a block diagram illustrating a flash memory device 30 that may be included as a portion of the system memory 26 of FIG. 1. As will be described further below with respect to FIG. 3, the flash memory device 30 may be a NAND flash memory device. The flash memory device 30 generally includes a memory array 32. The memory array 32 generally includes many rows and columns of conductive traces arranged in a grid pattern to form a number of memory cells. The rows or "row lines" that make up the memory array 32 are generally referred to as "wordlines." The columns or "column lines" are generally referred to as "bit lines" or "digit lines." The size of the memory array 32 (i.e., the number of memory cells) will vary depending on the size of the flash memory device 30.

To access the memory array 32, a row decoder block 34 and a column decoder block 36 are provided and are configured to receive and translate address information from the processor 12 via the address bus 38 and the address buffer 40 to access a particular memory cell in the memory array 32. A sense amplifier block 42 having a plurality of the sense amplifies is also provided inline with the column decoder 36 and the memory array 32 to sense and amplify individual values stored in the memory cells. A row driver block 46 is provided to activate a selected word line in the memory array according to a given row address.

An internal voltage source 44, such as a voltage generator, is provided to deliver voltages for use within the memory device 30. For instance, the internal voltage source 44 may provide voltage levels for program, read and erase operations. As will be described further below with respect to FIGS. 5-12, the internal voltage source 44 may include a trimming circuit to accurately regulate the voltage level output by the internal voltage source 44.

During read and program operations, data may be transferred to and from the flash memory device 30 via the data bus 48. The coordination of the data and address information may be conducted through a control circuit 50. Further, the control circuit 50 may be configured to receive control signals from the processor 12 via the control bus 52. A command buffer 54 may be configured to temporarily store commands of the control circuit 50. The control circuit 50 is coupled to each of the row decoder block 34, the column decoder block 36, the address buffer 40, the sense amplifier block 42, the internal voltage generator 44, the row driver block 46, and the command buffer 54, and is generally configured to coordinate timing and control among the various circuits in the flash memory device 30.

Figure 3:
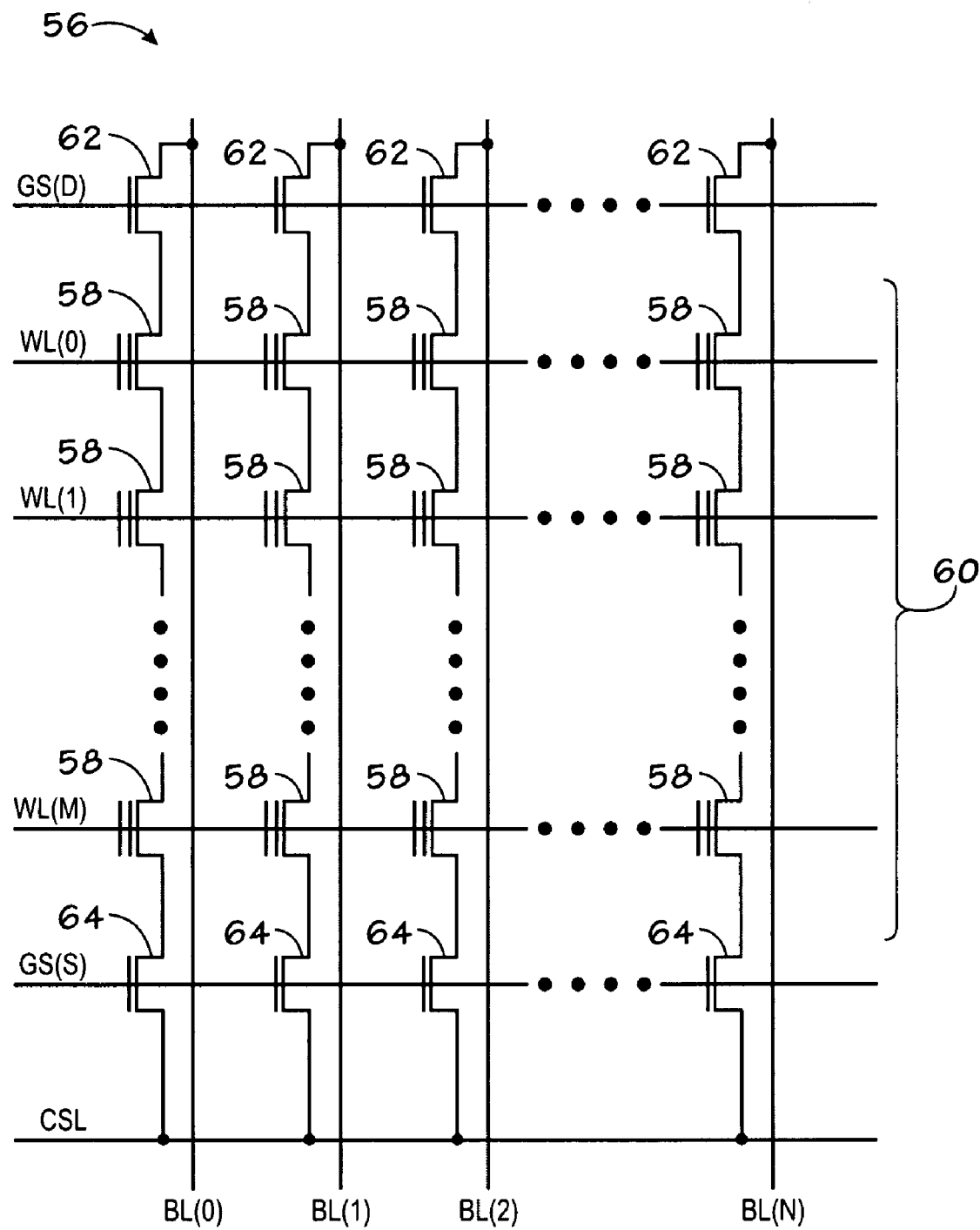
FIG. 3 is schematic diagram of a NAND flash memory array having memory cells fabricated in accordance with one or more embodiments of the present invention.

FIG. 3 illustrates an embodiment of the memory array 32, of FIG. 2. In the present embodiment, the memory array 32 comprises a NAND memory array 56. The NAND memory array 56 includes word lines WL(0)-WL(M) and intersecting local bit lines BL(0)-BL(N). As will be appreciated, for ease of addressing in the digital environment, the number of word lines WL and the number of bit lines BL are each a power of two (e.g., 256 word lines WL by 4,096 bit lines BL). The local bit lines BL are coupled to global bit lines (not shown) in a many-to-one relationship.

The NAND memory array 56 includes a floating gate transistor 58 located at each intersection of a word line WL and a local bit line BL. The floating gate transistors 58 serve as non-volatile memory cells for storage of data in the NAND memory array 56, as previously described. As will be appreciated, each floating gate transistor includes a source, a drain, a floating gate, and a control gate. The control gate of each floating gate transistor 58 is coupled to a respective word line WL. The floating gate transistors 58 are connected in series, source to drain, to form a NAND string 60 formed between gate select lines. Specifically, the NAND strings 60 are formed between the drain select line GS(D) and the source select line GS(S). The drain select line GS(D) is coupled to each NAND string 60 through a respective drain select gate 62. Similarly, the source select line GS(S) is coupled to each NAND string 60 through a respective source select gate 64. The drain select gates 62 and the source select gates 64 may each comprise a field-effect transistor (FET), for instance. A column of the memory array 56 includes a NAND string 60 and the source select gate 64 and drain select gate 62 connected thereto. A row of the floating gate transistors 56 are those transistors commonly coupled to a given word line WL.

The source of each source select gate 64 is connected to a common source line CSL. The drain of each source select gate 64 is coupled to the source of a floating gate transistor 58 in a respective NAND string 60. The gate of each source select gate 64 is coupled to the source select line GS(S).

The drain of each drain select gate 62 is connected to a respective local bit line BL for the corresponding NAND string 60. The source of each drain select gate 62 is connected to the drain of a floating gate transistor 58 of a respective NAND string 60. Accordingly, as illustrated in FIG. 3, each NAND sting 60 is coupled between a respective drain select gate 62 and source select gate 64. The gate of each drain select gate 62 is coupled to the drain select line GS(D).

During operation of the NAND memory array 56, various voltages are generated within the memory device 30. For instance, the memory device may require multiple voltage levels applied to the word lines, bit lines, and the like, to program, read, erase and verify values stored in the cells of the memory array 30. Accordingly, the voltage generator 44 of FIG. 2 may be representative of one or multiple internal voltage generators 44 that each output a specific voltage. During operation, each internal voltage generator 44 may receive and condition an externally supplied voltage, e.g., common bus voltage, and output a voltage level (i.e., "output voltage") desired for the various operations within the memory device 30. It is generally desired that each output voltage include an accurate voltage level so that each memory operation, i.e., program, read, erase and verify, is conducted properly. If the voltage level is not accurate, the charge induced to program the cell or the charge sensed to read from a cell may not be correct and, thus, the data programmed and/or read may be inaccurate, i.e., a bit may be stored to or read from a cell incorrectly.

A solution includes testing each internal voltage generator 44 to verify that each output voltage is accurate; however, verifying each voltage level can be a time consuming and labor intensive process. The time and effort may be increased as the number of voltage levels to be checked increases. For instance, a multi-level cell (MLC) that stores two bits of data, using four voltage levels, may require trimming, e.g., adjusting, the voltage levels for a program voltage, a read voltage, three program verify voltages, three read verify voltages, and one erase verify voltage. Further, if the memory device 30 requires multiple voltage generators for each voltage level, or there are multiple memory devices 30, the time and effort required to trim and verify each voltage can increase exponentially.

Figure 4:
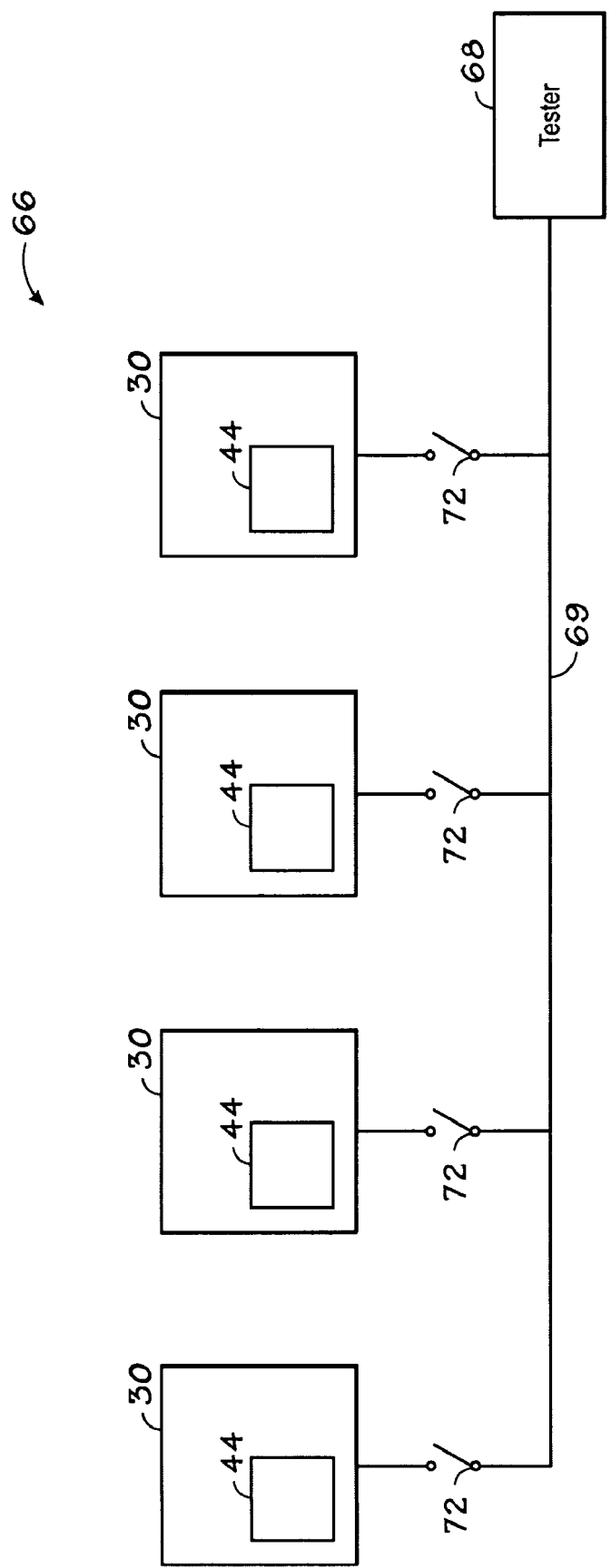
FIG. 4 illustrates a testing setup in accordance with one or more embodiments of the present invention.

Turning briefly to FIG. 4, a voltage testing setup is illustrated and generally designated by reference numeral 66. The test setup 66 includes a single tester 68 connected to a test bus 69. The test bus 69 may connect the tester 68 to at least one of a plurality of memory devices 30. The connection is controlled by the state of switches 72. In a general testing configuration, the tester 68 is configured to receive a test voltage from one of the memory devices 30 and verify the voltage level. If the voltage level is not correct, the tester 68 may return a signal to the memory device 30 that is configured to modify the voltage output by the memory device 30, such that the voltage level is acceptable. For instance, the memory device 30 may include an internal voltage generator 44 that is configured to output a 5 volt (V) level to the memory array 32 during normal operation of the memory device 30. To verify that the internal voltage generator 44 is outputting the proper voltage level (5V), a single switch 72 may be closed between the memory device 30 and the tester 68, such that the voltage is routed to the tester 68 via the test bus 69. The tester 68 senses the output voltage and determines if the output voltage level is within a given range (e.g., 4.9V to 5.1V). If it is not, the tester 68 may return a signal to the memory device 30 and the internal voltage generator 44 that is configured to modify the voltage level. For instance, the tester 68 outputs a signal configured to modify the resistance of a resistor in a voltage divider circuit within the internal voltage generator 44 to "trim" the output voltage level. Accordingly, the tester 68 may repeat a similar process for each output voltage of each of the internal voltage generators 44 in the test setup 66. For example, if each internal voltage generator 44 outputs a single voltage level, the tester 68 would repeat this process four times, closing one switch 72 at a time, to read and trim each voltage level for each memory device 30.

The following system and techniques are considered to reduce the amount of time and labor expended to test and trim each of the voltages output by multiple memory devices 30 and/or multiple internal voltage generators 44. In accordance with the techniques described below, the tester 68 may generate a test voltage that is simultaneously routed to multiple memory devices 30 and/or internal voltage generators 44. The common test voltage provides for simultaneously trimming the output voltage level of multiple voltage generators 44. For instance, in certain embodiments, the internal voltage generator 44 includes an on-board trimming circuit, such that the internal voltage generator 44 can regulate the output voltage level based on the test voltage. In other words, during a "trimming operation" the tester 68 can provide the internal voltage generator 44 with a "known" voltage level, and the internal voltage generator 44 can adjust its circuitry to output an accurate voltage level during normal operation. The ability of the internal voltage generator 44 to make internal adjustments based on the test voltage may eliminate the need for the tester 68 to individually monitor and adjust each output voltage of each internal voltage generator 44. For instance, in certain embodiments, the tester 68 can output a test voltage to the test bus 69, with all of the switches 72 closed, such that each of memory devices 30 and internal voltage generators 44 receive the test voltage. Thus, the internal voltage generators 44 can simultaneously make internal adjustments to trim their output voltages. In certain embodiments, the test setup 66 may include increased flexibility with a tester 68 that can step through multiple voltage levels. Further, the tester 68 may exchange control signals with the memory devices 30 such that the test voltage is routed and processed by each internal voltage generator 44 accordingly.

Figure 5:
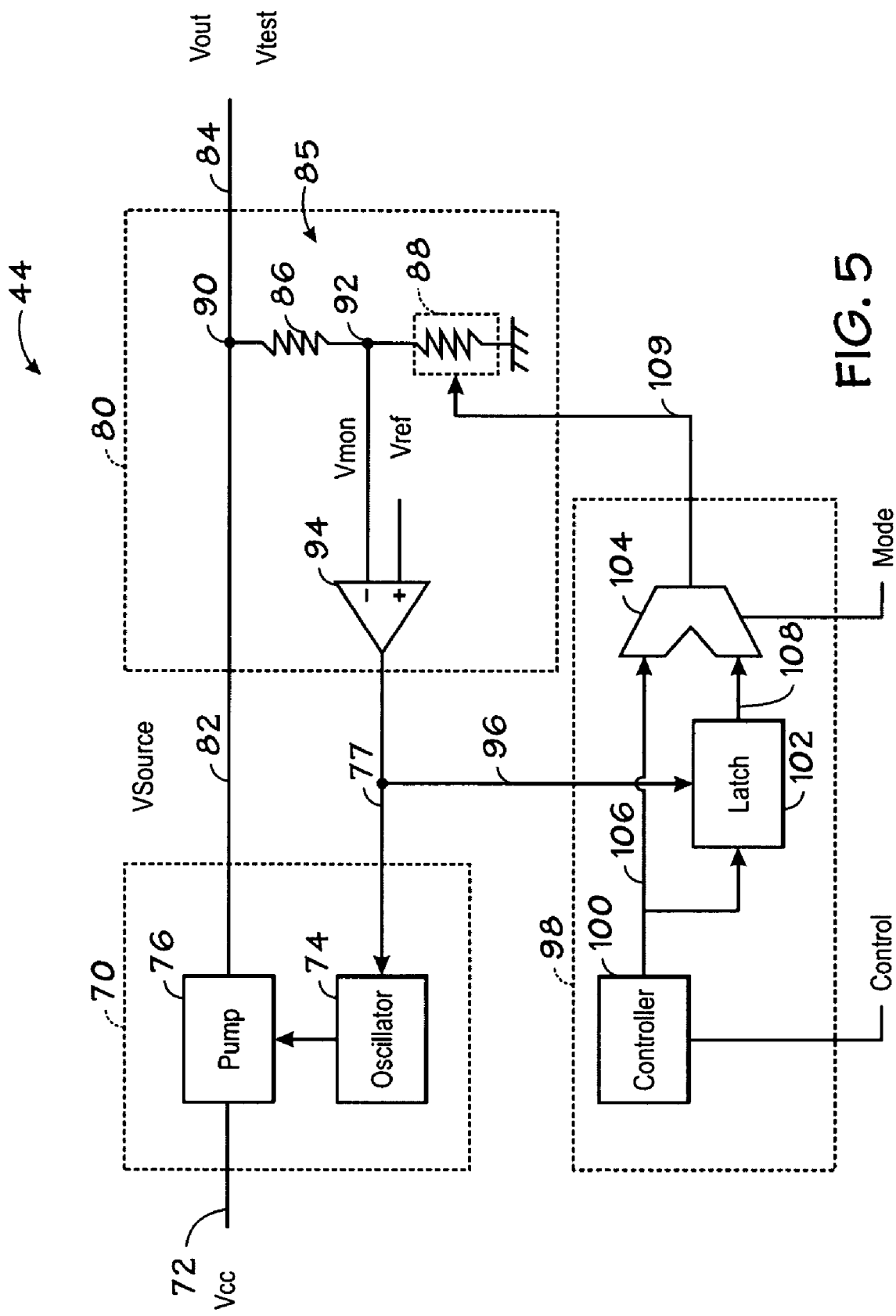
FIG. 5 illustrates an embodiment of a high-voltage internal voltage generator of the memory device of FIG. 2.

FIG. 5 is a block diagram of an internal voltage generator 44. General operation of the internal voltage generator 44 includes receiving a supply voltage (Vcc), conditioning the supply voltage, and providing an output voltage (Vout) at a given voltage level. During trimming operation of the internal voltage generator 44, a test voltage (Vtest) may be received by the internal voltage generator 44 and used to calibrate internal circuitry of the internal voltage generator 44 such that the output voltage level is accurate during normal operation.

As depicted, the internal voltage generator 44 includes a voltage source circuit 70 configured to receive a supply voltage (Vcc) via a supply input 72. The supply voltage may be received from an external source, such as a power bus of the memory device 30. For example, the supply voltage may include a 5 V level supplied to multiple components within the memory device 30. In a "high voltage" embodiment, the internal voltage generator 44 may be configured to output a source voltage that is higher than the supply voltage. Accordingly, the voltage source circuit 70 also includes an oscillator 74 and a charge pump 76 configured to output a source voltage (Vsource) at a voltage level at or above the supply voltage. During normal operation of the internal voltage generator, the voltage source circuit 70 may receive a feedback signal (Vfeed) that is configured to enable the voltage source circuit 70 to adjust the level of the source voltage accordingly. For instance, the oscillator 74 may transmit a clock signal to the charge pump 76 based on a feedback signal received by the voltage source circuit 70 via a feedback path 77. Based on the clock signal, the charge pump may output the source voltage to a voltage detector circuit 80 via a path 82.

The voltage detector circuit 80 is generally configured to compare the test voltage received from the tester (e.g., the voltage level at the output 84 (which may be a voltage corresponding to the same, e.g., divided voltage Vmon)) to a reference voltage, and to provide the feedback voltage to the voltage source circuit 70 and a trimming circuit based on the comparison. The voltage detector circuit 80 includes a connection between the path 82 and the output 84 such that the voltage level at the path 82 is generally equal to the voltage level at the output 84. During the normal mode of operation, the source voltage is supplied to the path 82, and, thus, the voltage at the output 84 is equivalent to the source voltage. In the trimming mode of operation, the test voltage may be input on the output 84 such that the voltage at the output 84 is equivalent to the test voltage.

The voltage detector circuit 80 also includes a voltage divider 85 that includes a first resistor 86 and a trimming resistor 88 disposed in series between a first node 90 and ground. The voltage divider 85 includes a divided voltage, referred to as the monitor voltage (Vmon), at a second node 92. The monitor voltage is given by:

$$V_{mon} = V_{out} * \frac{R1}{R1 + R2} \quad (1)$$

Where, $V_{mon}$ is the monitor voltage, $V_{out}$ is the voltage at the first node 90, R1 is the resistance value of the first resistor 86, and R2 is the resistance value of the trim resistor 88.

The trimming resistor 88 may include a variable resistance value, such that the ratio of Vmon to Vout may be varied by varying the resistance value of the trim resistor 88. For instance, in an embodiment, the trim resistor 88 may include a transistor connected in parallel to a second resistor within the trim resistor 88, such that adjusting the voltage across the gate of the transistor varies the resistance of the trim resistor 88. Further, the trim resistor 88 may include an input, such that providing a trim value enables the trim resistor 88 to adjust its resistance. For example, the trim resistor 88 may be capable of receiving a binary value indicative of a resistance value, and, subsequently vary the resistance of the trim resistor 88 accordingly. As will be appreciated, varying the resistance value will vary the monitor voltage (Vmon) relative to the voltage at the first node 90 (Vout).

To compare the monitor voltage to a reference voltage (Vref), the voltage detector circuit 80 includes a comparator 94. As depicted, the monitor voltage is input to a first input (−) of the comparator 94 and the reference voltage is input to a second input (+) of the comparator 94. The reference voltage may include a "known" voltage level that is supplied from an external device, the memory 30, or the like. In operation, the comparator 94 amplifies the voltage difference between the positive (+) terminal and the negative (−) terminal and outputs a feedback/latch signal indicative of the difference. The feedback/latch signal may be transmitted to the voltage source circuit 70 and/or a trimming circuit 98 via a path 96. In one embodiment, the feedback signal includes a digital low signal when the monitor voltage is higher than the reference voltage and a digital high signal when the monitor voltage is below the reference voltage.

The trimming circuit 98 is generally configured to provide the trim value to the trimming resistor 88, mentioned above. As depicted, the trimming circuit 98 includes a controller 100, a latch 102 and a multiplexer 104. In one embodiment, the controller 100 outputs a sequence of test trim values, the latch 102 outputs a latch trim value, and the multiplexer 104 selects one of the test trim value and the latch trim value as the trim value output to the trimming resistor 88. The operation of the trimming circuit 98 may vary based on the current mode of operation of the internal voltage generator 44. For example, during a trimming operation, controller 100 may receive a control signal that is indicative of the present trimming conditions. The control signal may include a signal transmitted from the tester 68 and configured to provide information, such as the current voltage level being input to the voltage detector circuit 80 via the output 84. Based on this information, the controller 100 may output a sequence of test trim values that are transmitted in parallel to the latch 102 and the multiplexer 104 via a path 106. The latch 102 may receive the test trim values, but may not store them in its buffer memory unless the feedback/latch signal transitions to a state indicating the need to latch the value. For example, the feedback/latch signal may transition from a digital low to digital high signal when the monitor voltage is below the reference voltage level, thus indicating a valid trim value. The latch 102 may output the present value stored in its buffer to the multiplexer 104 via a path 108 as a latch trim value. The multiplexer 104 receives the test trim value and the latch trim value, and outputs one of the two values based on the mode signal. The mode signal may include a digital signal that changes states based on the present mode of operation. For instance, during a trimming operation, the mode signal may enable the multiplexer 104 to output the test trim value as the trim value.

In contrast, during normal operation, the multiplexer 104 may receive a mode signal that indicates normal operation and output the latch trim value to the trimming resistor 88 via a path 109. Accordingly, the trimming circuit 98 outputs a constant trim value to the trim resistor 88 via path 109 during normal operation.

Figure 6:
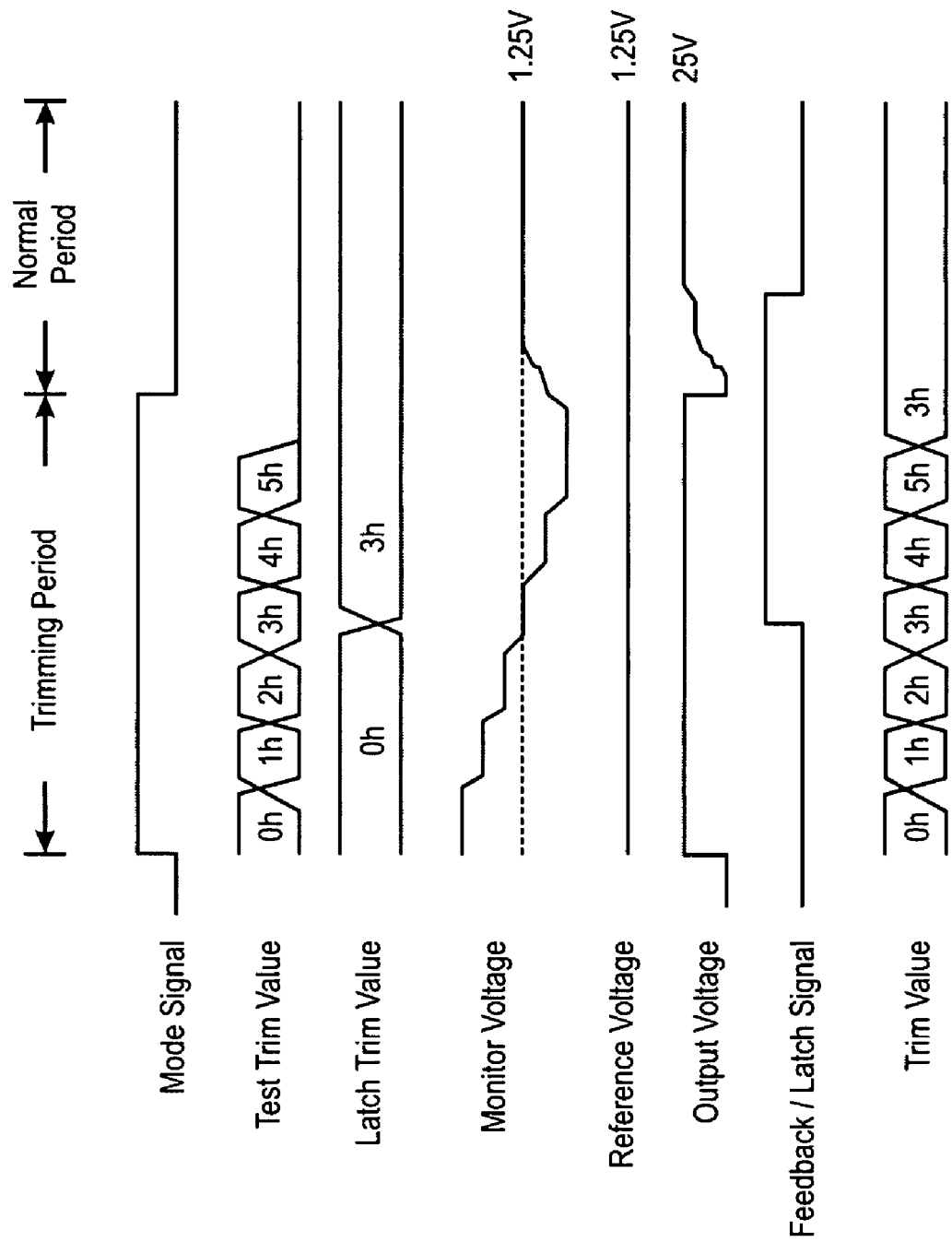
FIG. 6 illustrates a timing diagram associated with the operation of the embodiment of the internal voltage generator of FIG. 5.

FIG. 6 illustrates various signals during an embodiment that includes a trimming period followed by a period of normal operation. As depicted, during the trimming period, the mode signal includes a digital high signal. A test voltage (25V) is applied at the output 84, as represented by the output voltage. The controller 100 initially outputs the first of a sequence of test trim value, as indicated by 0h. The latch 102 initially outputs a latch trim value (0h). Because the mode signal input to the multiplexer 104 still indicates a trimming period, the first test trim value is passed to the trim resistor 88, as indicated by the initial trim value of 0h. At the start of the trimming period, the monitor voltage is above the reference voltage. Accordingly, the feedback/latch signal is a digital low signal. As trimming continues, the controller 100 outputs a sequence of test trim values, as indicated by "test trim value," and the trim value varies sequentially from 0h to 5h. As the trim value is increased, the monitor voltage level continues to decrease, and eventually drops below the reverence voltage level, e.g. 1.25 V, at a trim value of 3h. When the monitor voltage level drops below the reference voltage level, the feedback/latch signal changes states, e.g., low to high. In response to the digital high feedback/latch signal, the latch 102 stores the present trim value, e.g., 3h, and continuously outputs that 3h value as the latch trim value. Subsequently, the controller 100 continues to sequence the test trim value to 5h, and the monitor voltage level continues to decrease. After the trimming period has completed, the mode signal transitions to indicate a return to a normal operating state, e.g., a digital low mode signal. In response to the digital low mode signal, the multiplexer 104 outputs the latch trim value, e.g., 3h, as the trim value. Subsequently, the output voltage is generated by the internal voltage generator 44, and settles at the desired output level e.g., 25V. As depicted, the feedback/latch signal may continue to change states during normal operation to provide feedback to the voltage source circuit 70, as discussed previously.

Figure 7:
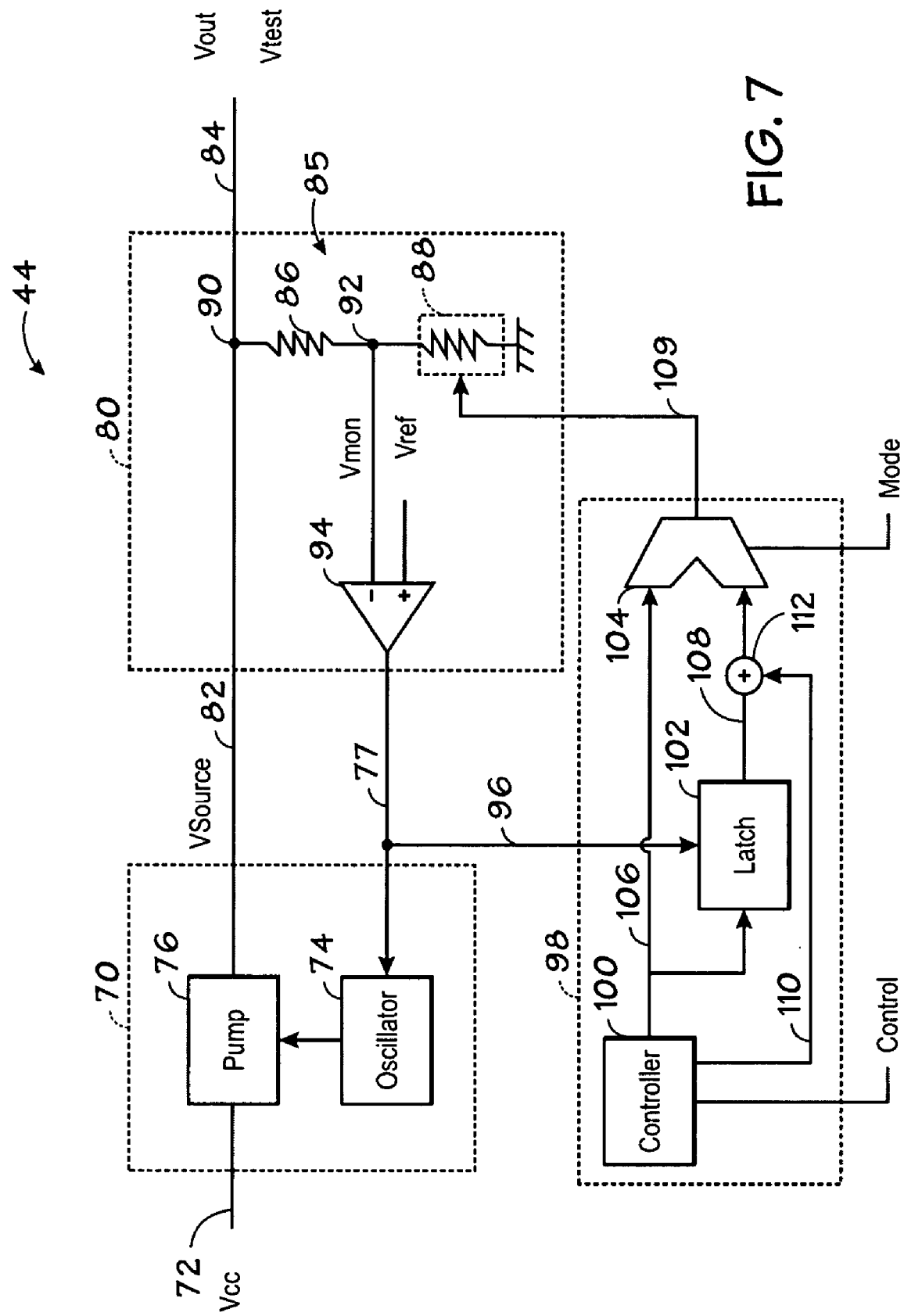
FIG. 7 illustrates an embodiment of a high-voltage internal voltage generator of the memory device of FIG. 2, including a configuration for step-up pulsing.

The previously described embodiments include varying the trim value during a trimming period and providing a constant trim value during normal operation; however, it may be desired that the trim value is varied during normal operation to adjust the output of the voltage divider, and, thus, adjust the source voltage and the output voltage. In other words, adjusting the value of the trim resistor 88 varies the feedback/latch signal to the voltage source circuit 70 and, in response, the voltage source circuit 70 may adjust its output (e.g., the source voltage) to a different level based on the feedback. FIG. 7 illustrates an embodiment configured to provide for adjustment of the trim value during normal operation. The illustrated embodiment includes a circuit similar to the circuit illustrated in FIG. 5; however, the circuit of FIG. 7 includes a step value that is output from the controller 100 via a path 110. The step value is added to the latch trim value at block 112 to provide a step trim value to the multiplexer 104 via a path 114. The step trim value is the sum of the latch trim value and the step value. Accordingly, during normal operation the controller 100 may output an additional value that is added to the latch trim value during normal operation. Thus, the multiplexer 104 may be configured to pass the step trim value to the trim resistor 88 in place of the latch trim value, as described above with reference to FIGS. 5 and 6. Variation of the resistance of the trim resistor 88 may cause the output voltage to vary during normal operation.

Figure 8:
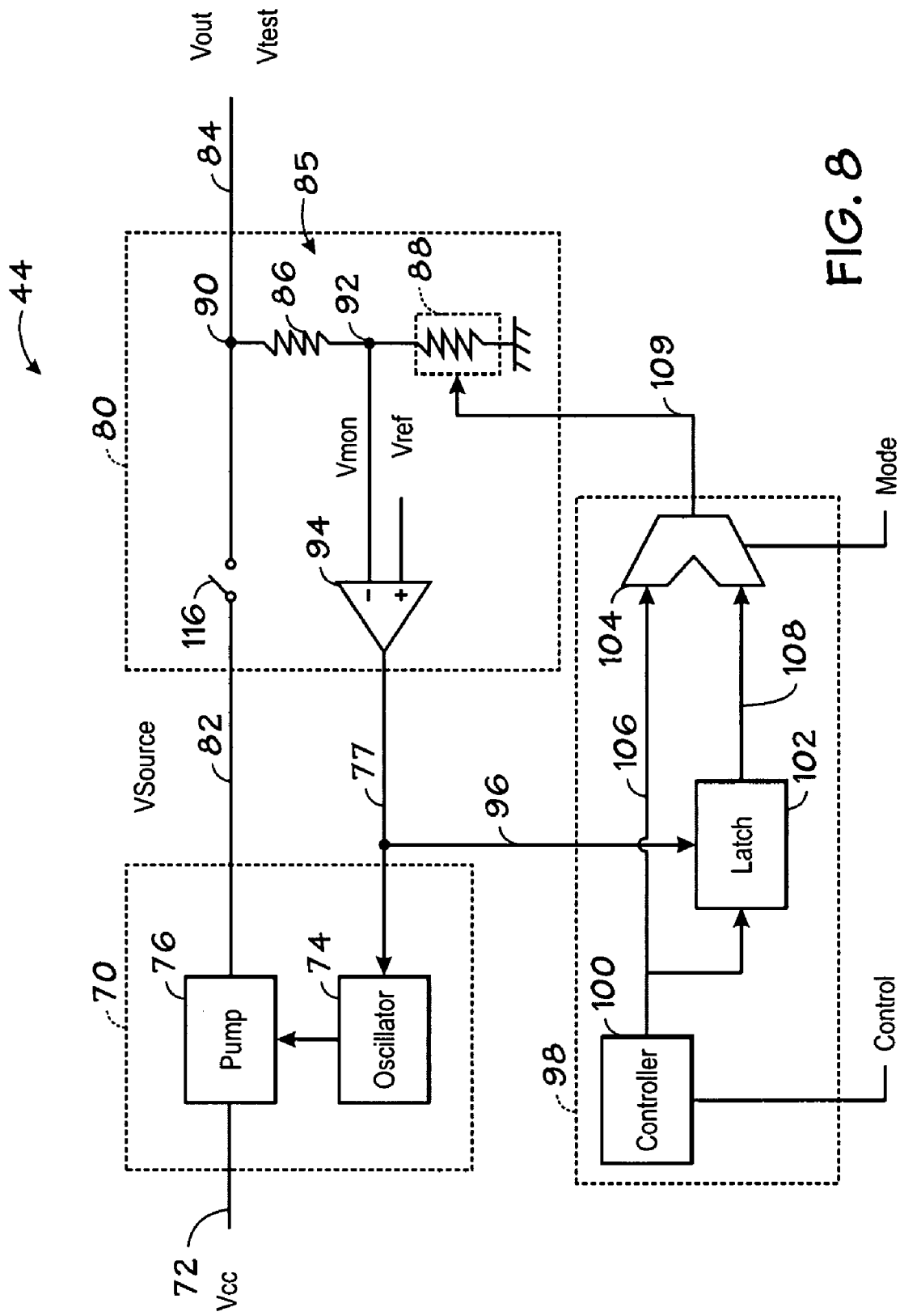
FIG. 8 illustrates an embodiment of a high-voltage internal voltage generator of the memory device of FIG. 2, including a switch to reduce interference.

Further, it may be desirable to reduce the potential for interference between the components of the internal voltage generator 44 during various modes of operation. For example, during the trimming mode of operation, it may be desirable to disconnect outputs of the voltage source circuit 70 (e.g., path 82) from the output 84. Accordingly, in one embodiment, a switch may be located within the voltage detector circuit 80. For instance, FIG. 8 illustrates a switch 116 that can be opened to separate an output of the voltage source circuit 70 (e.g., the source voltage) from the output 84 of the voltage detector circuit 80 (e.g., the output voltage). During the trimming mode of operation, the switch 116 may be opened such that the test voltage is input via the output 84 without interference from the source voltage on the path 82. During normal operation, the switch 116 may be closed to enable the source voltage to pass through the voltage detector circuit 80 as described above with reference to FIG. 5.

Figure 9:
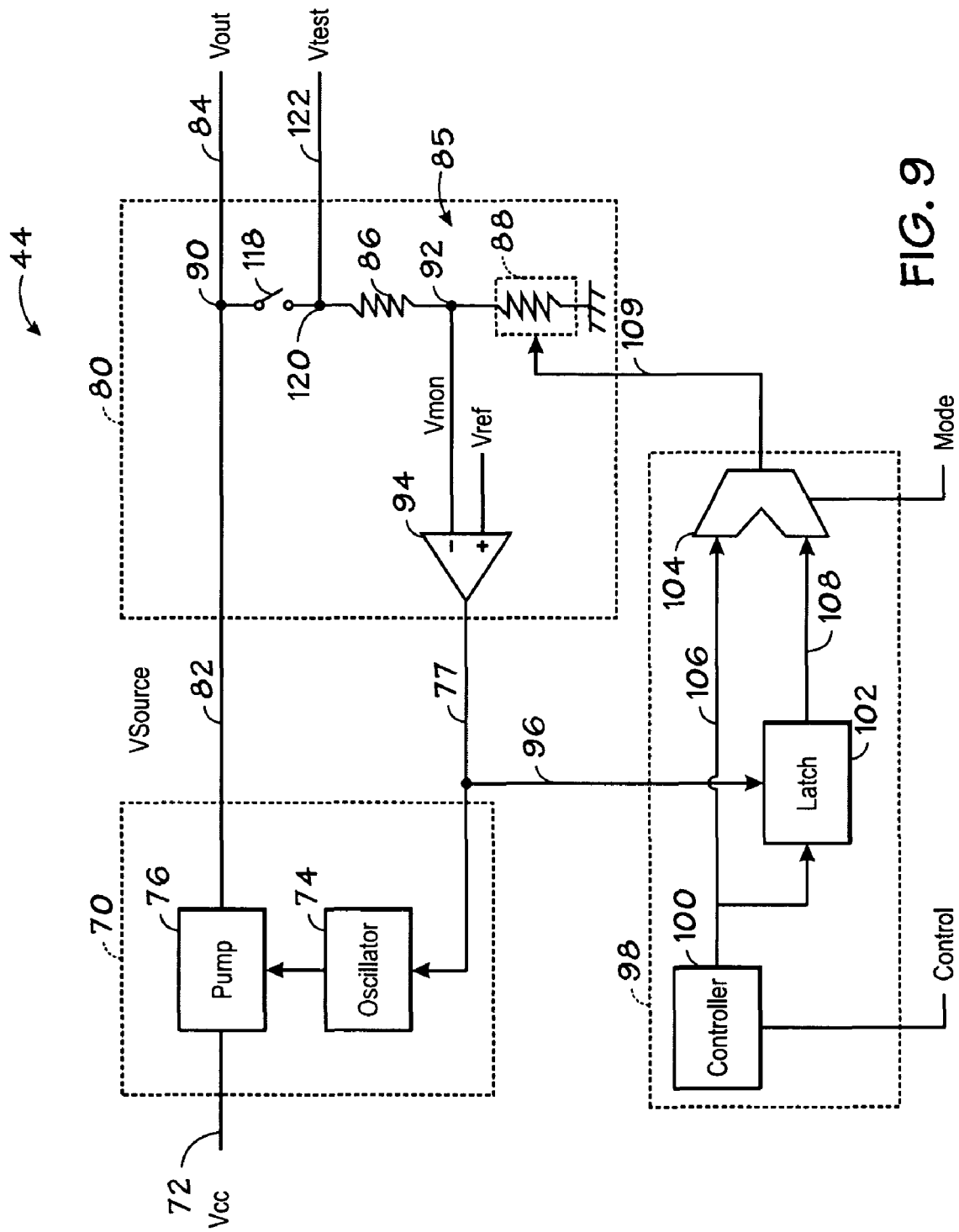
FIG. 9 illustrates an embodiment of a high-voltage internal voltage generator of the memory device of FIG. 2, including a switch to reduce interference.

Similarly, FIG. 9 illustrates an embodiment including a switch 118 configured to isolate a test voltage input from interference generated by a voltage on the output 84. The switch 118 is located between the first resistor 86 of the voltage divider 84, and the node 90. Accordingly, the test voltage may be input to a node 120 via a test voltage input 122. During the trimming operation, the test voltage may be provided to the voltage detector circuit 80 via the test voltage input 122 with the switch 118 open to prevent interference due to the output voltage or the source voltage. During normal operation, voltage may be removed from test voltage input 124, and the switch 122 may be closed to enable the source voltage to pass through the voltage detector circuit 80 to the output 84 as described above with reference to FIG. 5.

Figure 10:
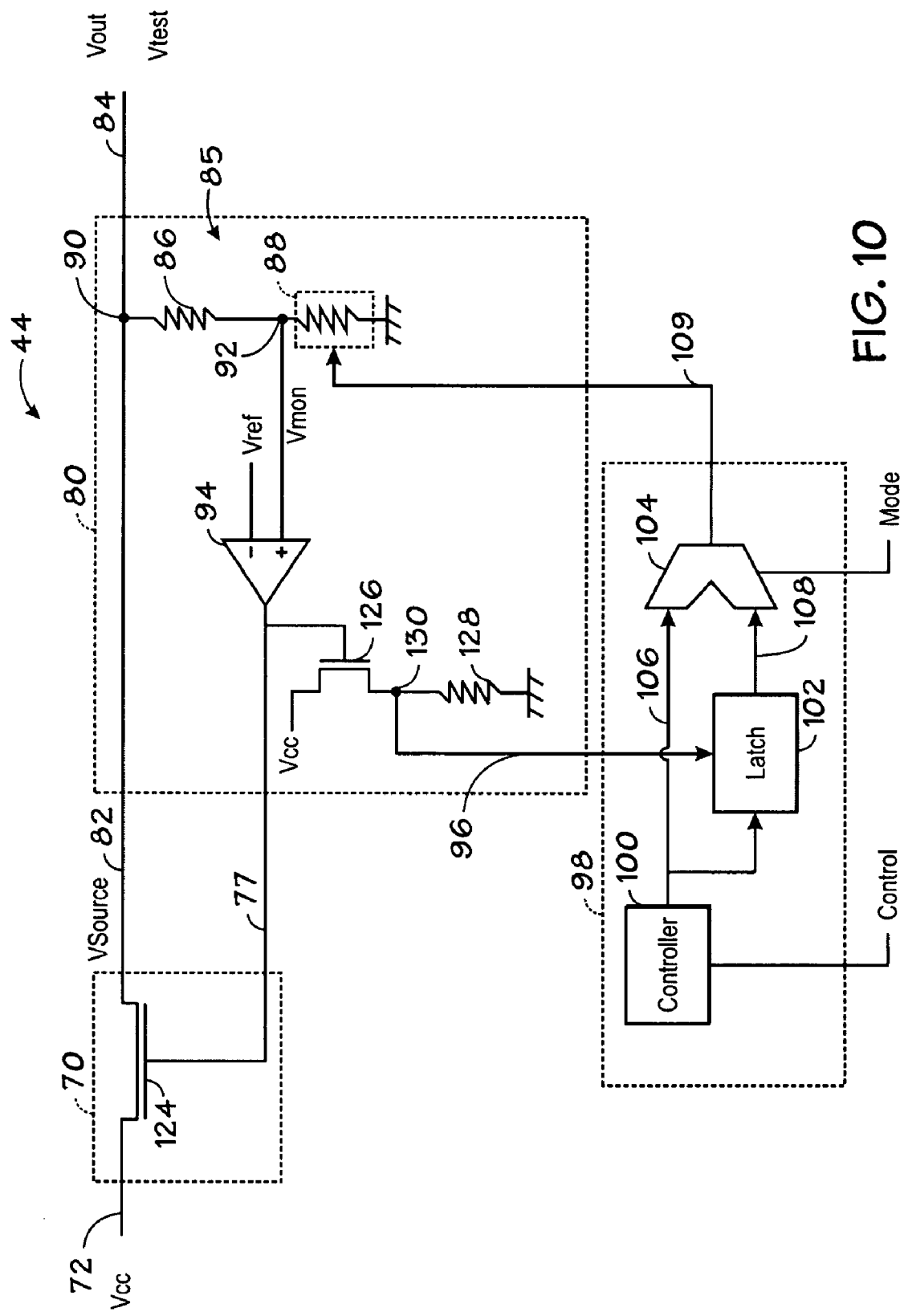
FIG. 10 illustrates an embodiment of a low-voltage internal voltage generator of the memory device of FIG. 2.

Although the embodiments of FIGS. 5-9 generally include the voltage source circuit 70 configured to output the source voltage at a higher level than the supply voltage, other embodiments include the voltage source circuit 70 configured to output the source voltage at a level about the same or lower than the supply voltage level. For example, if the supply voltage includes a 5 volt signal, and a "low voltage" (e.g., below about 2-3 volts) output is desired, the internal voltage generator 44 may include additional circuitry. Turning now to FIG. 10, the internal voltage generator 44 includes a voltage source circuit 70 that includes a load transistor 124 that is configured to output a source voltage level at or below the supply voltage level. During normal operation and trimming operation, the control gate of the load transistor 124 receives the feedback voltage from the comparator 94 of the voltage detector circuit 80. The load transistor 124 regulates the supply voltage based on the feedback voltage. The load transistor 124 may include various forms, such as a PMOSFET type transistor, configured to reduce the supply voltage to the appropriate level. In other embodiments, other circuitry may be used in place of or in addition to the load transistor 124 to reduce the supply voltage to the appropriate level.

In one embodiment, the comparator 94 may output a digital signal, as discussed previously with regard to FIG. 6; however, in other embodiments, the comparator 94 may output an analog signal indicative of the difference between the reference voltage and the monitor voltage. As discussed previously, the latch 102 is configured to store a latch trim value based on the digital feedback/latch signal. Accordingly, in an embodiment where the comparator 94 outputs an analog output, the feedback/latch signal may be converted to a digital signal before being passed to the latch 102. In one embodiment, the internal voltage generator 44 includes additional circuit configured to convert the analog feedback/latch signal to a digital latch signal. As depicted in FIG. 10, the feedback/latch signal is feed to a transistor 126 that is in series with a resistor 128. With the supply voltage provided at the source of the transistor 126, the voltage at a node 130 may include a digital latch signal. During operation, the digital latch signal may remain low when the monitor voltage is above the reference voltage and transition to a digital low when the monitor voltage drops below the reference voltage. Therefore, the trimming circuit 98 and the latch 102 may operate based on the digital latch signal as described above with reference to the feedback/latch signal.

Figure 11:
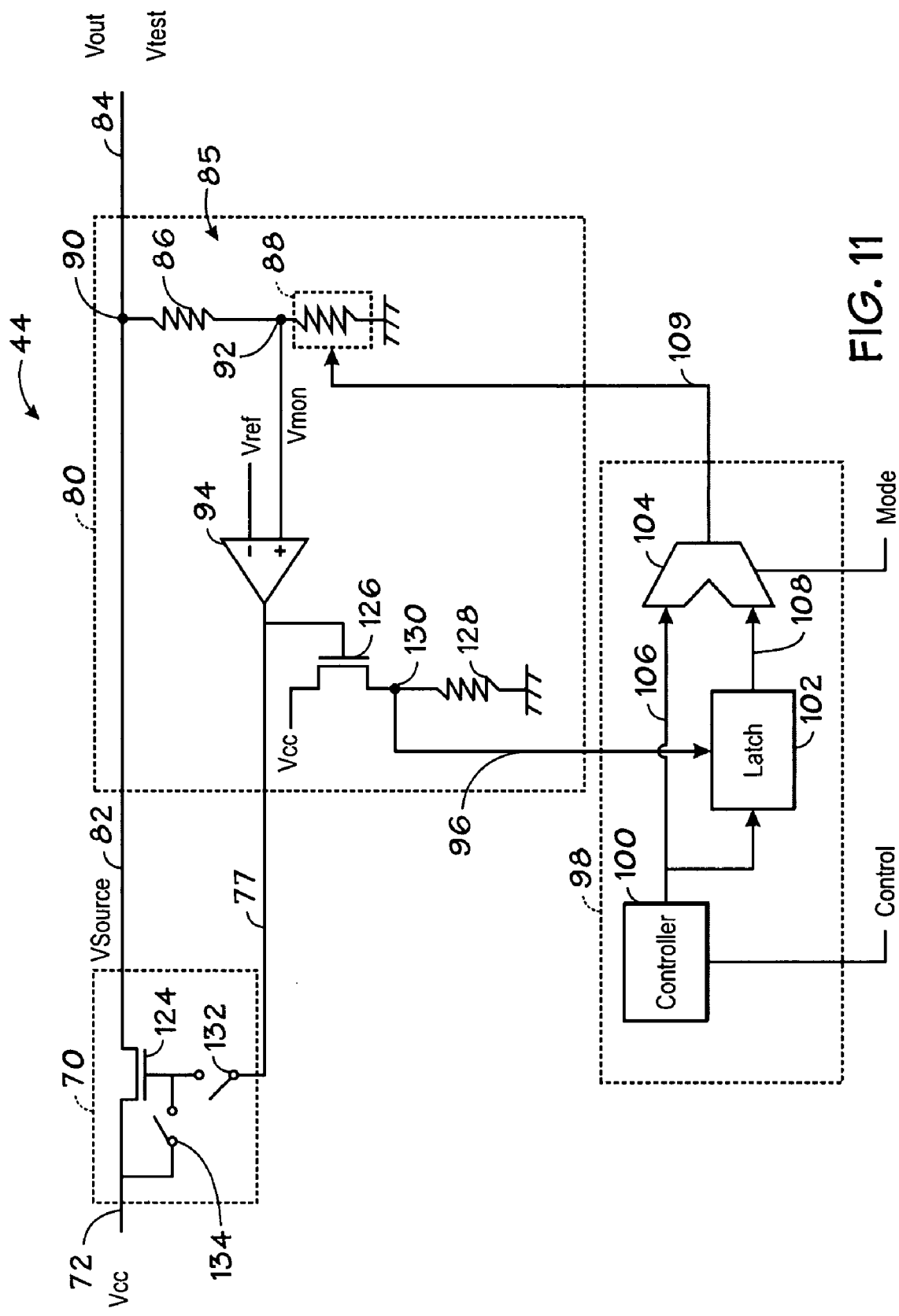
FIG. 11 illustrates an embodiment of a low-voltage internal voltage generator of the memory device of FIG. 2, including a plurality of switches to reduce interference.

During trimming mode and normal operation, it may be desirable to reduce the potential for interference between components of the internal voltage generator 44. FIG. 11 depicts an embodiment including a plurality of switches configured to cut the feedback loop between the output of the comparator 94 and the gate of the load transistor 124. A feedback switch 132 is located on the path 77 between the comparator 94 and the transistor 124, and a supply switch 134 is located between the terminal connected to the supply voltage on the path 72 on one end and between the load transistor 124 and the supply feedback switch 132 on the other end. During normal operation, the feedback switch 132 is closed and the supply switch 134 is closed to allow the feedback signal to control the load transistor 124 as described above. During the trimming operation, the feedback switch 132 is opened and the supply switch 134 is closed. Closing the supply switch 134 helps to prevent the voltage at the gate of the load transistor 124 from floating. Thus, the output of the comparator 94 does not interfere with the test voltage input at the voltage output 82 and the load transistor 124 is held at a known state.

Figure 12:
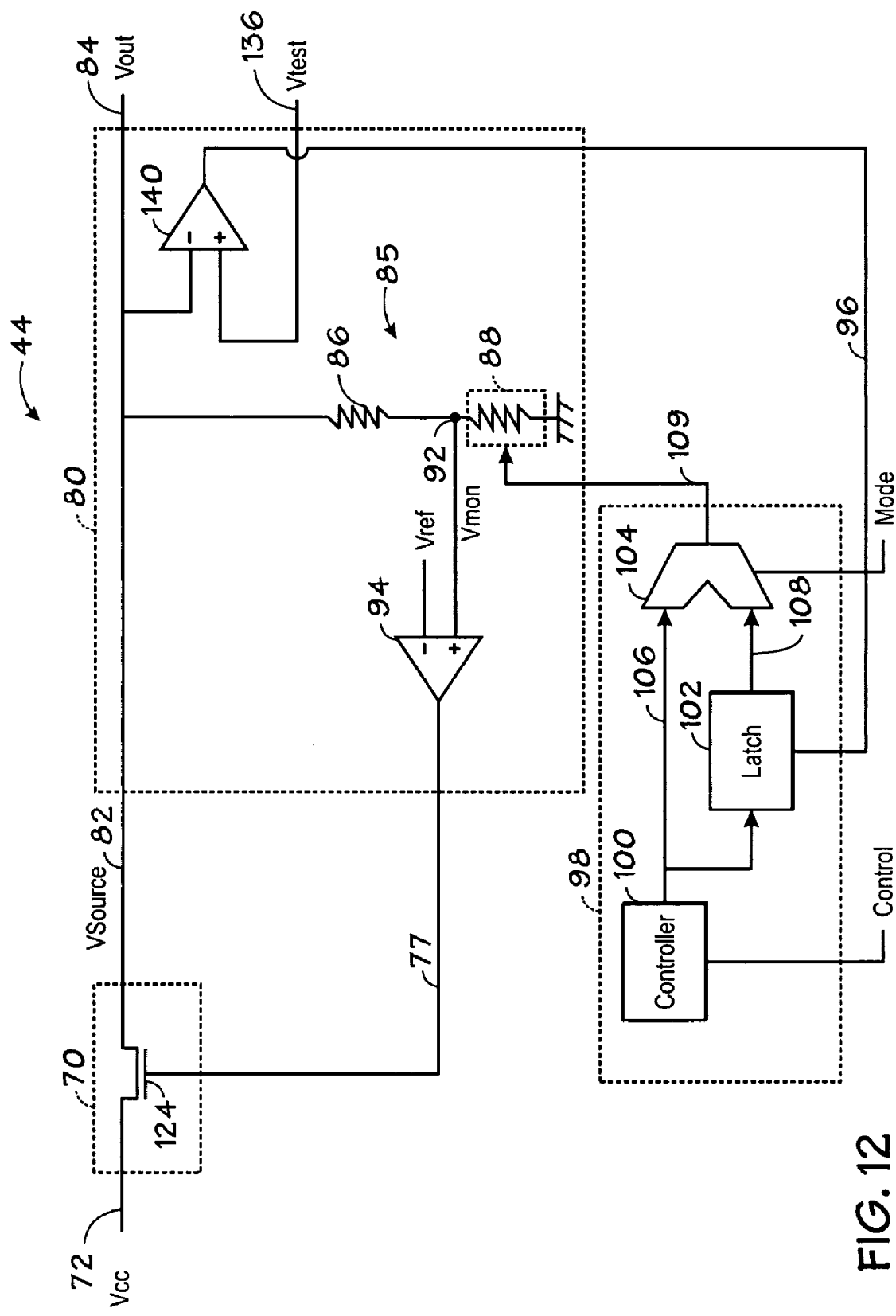
FIG. 12 illustrates another embodiment of a low-voltage internal voltage generator of the memory device of FIG. 2.

FIG. 12 illustrates another embodiment of the internal voltage generator 44 configured to output a "low voltage" output. The internal voltage generator 44 includes the voltage output 84 for outputting the output voltage during normal operation and a separate test voltage input 136 for inputting a test voltage during the trimming operation. In the embodiment depicted in FIG. 12, the latch signal is generated by a second comparator 140. The second comparator 140 compares the test voltage to the output voltage directly, and outputs a latch signal to the latch 102. The second comparator 140 depicted in FIG. 12 may be employed in similar embodiments. For example, the internal trimming circuit 44 depicted in FIG. 9 may be modified to include the second comparator 140 providing the latch signal to the latch 102. Further, it should be noted that the embodiment depicted in FIG. 12 may be modified to enable the comparator 94 to provide the latch signal without the addition of the second comparator 140. For example, the latch signal may be provided from the feedback/latch signal, as discussed with regard to FIG. 5-9, and may include additional analog to digital conversion circuitry, as depicted and discussed with regard to FIGS. 10 and 11.

While the invention may be susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:
1. A memory device, comprising:
 a voltage detector circuit configured to receive a test voltage, a reference voltage, and a trimming signal, and configured to output a latch signal, wherein the test voltage is adjusted to an adjusted voltage based on the trimming signal and the latch signal is based on a comparison of the reference voltage and the adjusted voltage;

a voltage source configured to output a source voltage that is received by the voltage detector;

a switch coupled between the voltage source and the voltage detector circuit, wherein the switch is configured to disconnect the input voltage from the voltage detector circuit; and a trimming circuit configured to output the trimming signal based on a trim value and to set the trim value based on the latch signal.

2. The memory device of claim 1, wherein the test voltage is received from a test monitor.

3. The memory device of claim 1, wherein the test voltage is received from a test monitor in parallel with a second memory device that receives the test voltage from the test monitor.

4. The memory device of claim 1, wherein the reference voltage is externally provided.

5. The memory device of claim 1, wherein the latch signal is configured to indicate whether the adjusted voltage is approximately equal to the reference voltage.

6. The memory device of claim 1, wherein the trimming signal is configured to vary the ratio of the test voltage to the adjusted voltage.

7. The memory device of claim 1, wherein the voltage detector does not provide an output voltage during a test mode of operation, and wherein the voltage detector provides the output voltage during a normal mode of operation.

8. The memory device of claim 1, wherein the memory device outputs a signal that is indicative of a mode of operation.

9. The memory device of claim 1, wherein the voltage source is configured to output a voltage higher than about 2 volts.

10. The memory device of claim 1, wherein the voltage source is configured to output a voltage below about 3 volts.

11. A method, comprising:
  applying a test voltage to an input of a voltage generator;
  adjusting the test voltage to an adjusted voltage via one or more of a first feedback signal transmitted from a voltage detector circuit to a trimming circuit and a second feedback signal transmitted from the voltage detector circuit to an oscillator of the voltage generator;
  comparing the adjusted voltage to a reference voltage;
  generating trim data based on the comparison;
  storing the trim data; and
  closing a feedback loop in the voltage generator to disconnect the test voltage from the output path based on the comparison.

12. The method of claim 11, comprising supplying the test voltage from an external source.

13. The method of claim 11, comprising supplying the test voltage to respective output paths of a plurality of voltage generators simultaneously.

14. The method of claim 13, wherein at least one of the plurality of voltage generators is disposed on a different memory device than another of the plurality of voltage generators.

15. The method of claim 11, comprising supplying the test voltage to respective output paths of a plurality of voltage generators in parallel.

16. The method of claim 1, comprising adjusting an output voltage based on the trim data.

17. The method of claim 1, comprising storing the trim data based on the comparison of the adjusted voltage to the reference voltage.

* * * * *

UNITED STATES PATENT AND TRADEMARK OFFICE
CERTIFICATE OF CORRECTION

PATENT NO.       : 8,013,579 B2
APPLICATION NO.  : 11/888829
DATED            : September 6, 2011
INVENTOR(S)      : Tanzawa Page 1 of 1

It is certified that error appears in the above-identified patent and that said Letters Patent is hereby corrected as shown below:

On the face page, in field (56), under "Other Publications", in column 2, line 8, delete "Jouirnal" and insert -- Journal --, therefor.

In column 12, line 30, in Claim 16, delete "claim 1," and insert -- claim 11, --, therefor.

In column 12, line 32, in Claim 17, delete "claim 1," and insert -- claim 11, --, therefor.

Signed and Sealed this
Twenty-second Day of November, 2011

David J. Kappos
*Director of the United States Patent and Trademark Office*